(12) United States Patent
Osawa et al.

(10) Patent No.: US 10,847,376 B2
(45) Date of Patent: Nov. 24, 2020

(54) IN-SITU DEPOSITION AND ETCH PROCESS AND APPARATUS FOR PRECISION PATTERNING OF SEMICONDUCTOR DEVICES

(71) Applicant: SANDISK TECHNOLOGIES LLC, Addison, TX (US)

(72) Inventors: Yusuke Osawa, Yokkaichi (JP); Syo Fukata, Yokkaichi (JP); Naoto Umehara, Yokkaichi (JP); Sung Tae Lee, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/380,260

(22) Filed: Apr. 10, 2019

(65) Prior Publication Data

US 2020/0006080 A1 Jan. 2, 2020

Related U.S. Application Data (60) Provisional application No. 62/691,136, filed on Jun. 28, 2018.

(51) Int. Cl.
*H01L 21/311* (2006.01)
*H01L 21/02* (2006.01)
(Continued)

(52) U.S. Cl.
CPC .. *H01L 21/31116* (2013.01); *H01J 37/32082* (2013.01); *H01J 37/32715* (2013.01); *H01L 21/0217* (2013.01); *H01L 21/0228* (2013.01); *H01L 21/02164* (2013.01); *H01L 21/31144* (2013.01); *H01L 21/67069* (2013.01); (Continued)

(58) Field of Classification Search
CPC ........... H01L 21/31144; H01L 21/0228; H01L 21/02164; H01L 21/0217; H01L 21/0337; H01L 21/31116; H01L 21/67069; H01J 37/32082; H01J 37/32715
USPC ....... 438/695, 696, 700, 701, 717, 722, 723, 438/724
See application file for complete search history.

(56) References Cited

U.S. PATENT DOCUMENTS

7,682,942 B2 3/2010 Chen et al.
7,713,818 B2 5/2010 Chan
(Continued)

*Primary Examiner* — Binh X Tran
(74) *Attorney, Agent, or Firm* — The Marbury Law Group, PLLC (57) ABSTRACT

A first material layer, a second material layer, and a photoresist layer may be formed over a substrate. The second material layer may be patterned by transfer of a lithographic pattern therethrough. A conformal spacer layer may be formed over the patterned second material layer in a chamber enclosure of an in-situ deposition-etch apparatus. Spacer films may be formed by anisotropically etching the conformal spacer layer in the chamber enclosure of the in-situ deposition-etch apparatus. The first material layer may be anisotropically etched using a combination of the patterned second material layer and the spacer films as an etch mask in the in-situ deposition-etch apparatus. A high fidelity pattern may be transferred into the first material layer with reduced line edge roughness, reduced line width roughness, and without enlargement of lateral dimensions of openings in the first material layer.

16 Claims, 8 Drawing Sheets

(51) Int. Cl.
*H01J 37/32* (2006.01)
*H01L 21/67* (2006.01)
*H01L 27/11551* (2017.01)
*H01L 27/11578* (2017.01)

(52) U.S. Cl.
CPC ..... *H01J 2237/18* (2013.01); *H01J 2237/334* (2013.01); *H01L 27/11551* (2013.01); *H01L 27/11578* (2013.01)

(56) References Cited

U.S. PATENT DOCUMENTS

| | | | |
|---|---|---|---|
| 7,732,235 B2 | 6/2010 | Scheuerlein et al. | |
| 7,759,201 B2 | 7/2010 | Petti et al. | |
| 7,786,015 B2 | 8/2010 | Chen et al. | |
| 7,981,592 B2 | 7/2011 | Chan | |
| 8,076,056 B2 | 12/2011 | Wang et al. | |
| 8,080,443 B2 | 12/2011 | Chen et al. | |
| 9,059,311 B1* | 6/2015 | Basker | H01L 27/092 |
| 9,093,480 B2 | 7/2015 | Makala et al. | |
| 9,331,094 B2 | 5/2016 | Hada | |
| 9,524,976 B2 | 12/2016 | Pachamuthu et al. | |
| 9,570,460 B2 | 2/2017 | Kanakamedala et al. | |
| 9,991,280 B2 | 6/2018 | Nakamura et al. | |
| 2010/0093187 A1* | 4/2010 | Lee | H01L 21/3146 438/780 |
| 2015/0076580 A1 | 3/2015 | Pachamuthu et al. | |
| 2015/0228762 A1* | 8/2015 | He | H01L 29/7851 257/410 |
| 2015/0364558 A1* | 12/2015 | Wu | H01L 29/41725 257/316 |
| 2015/0380272 A1* | 12/2015 | Wu | C23C 16/16 438/653 |
| 2016/0035742 A1 | 2/2016 | Kanakamedala et al. | |
| 2017/0236835 A1 | 8/2017 | Nakamura et al. | |
| 2018/0138049 A1* | 5/2018 | Ko | H01L 21/02164 |

* cited by examiner

IN-SITU DEPOSITION AND ETCH PROCESS AND APPARATUS FOR PRECISION PATTERNING OF SEMICONDUCTOR DEVICES

RELATED APPLICATIONS

The instant application claims the benefit of priority of provisional U.S. Application Ser. No. 62/691,136 filed on Jun. 28, 2018, the entire contents of which are incorporated herein by reference.

FIELD

The present disclosure relates generally to the field of semiconductor devices, and particular to in-situ deposition and etch processes and apparatus for precision patterning of semiconductor devices.

BACKGROUND

As the product generation progresses in three-dimensional memory devices incorporating vertical NAND strings, lateral dimension, the total number of layers stacked along the vertical direction increases to stack more memory elements in the vertical direction. In addition, devices are also scaled in horizontal directions to further increase the device density. To improve device scaling in the horizontal directions, the average minimum lateral dimensions (critical dimensions, "CD") for high aspect ratio openings and the variability of such lateral dimensions should be reduced.

SUMMARY

According to an embodiment of the present disclosure, a method of patterning a structure is provided, which comprises: forming a first material layer, a second material layer, and a photoresist layer over a substrate; lithographically patterning the photoresist layer; forming a patterned second material layer by transferring a pattern in the photoresist layer through the second material layer using an anisotropic etch process; depositing a conformal spacer layer over the patterned second material layer in a chamber enclosure of an in-situ deposition-etch apparatus; forming spacer films by anisotropically etching the conformal spacer layer in the chamber enclosure of the in-situ deposition-etch apparatus; and anisotropically etching the first material layer using a combination of the patterned second material layer and the spacer films as an etch mask in the in-situ deposition-etch apparatus.

According to another embodiment of the present disclosure, an in-situ deposition-etch apparatus is provided, which comprises: a chamber enclosure; a chuck configured to support a substrate thereupon and located within the chamber enclosure; a gas manifold configured to provide at least one deposition gas and at least one etchant into the chamber enclosure; a radio frequency (RF) electromagnetic field generator configured to provide a radio frequency electromagnetic field within the chamber enclosure; and a vacuum pump and a vacuum pump manifold connecting the vacuum pump to the chamber enclosure.

DETAILED DESCRIPTION

As discussed above, the embodiments of the present disclosure are directed to deposition and etching process and apparatus, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Reduction of lateral dimensions in high aspect ratio openings through use of fluorocarbon polymer during a reactive ion etch process has been previously attempted. But capping margin degradation through low step coverage prevented successful application of such an approach. In another prior method, lithographic resist trimming was attempted to improve line edge roughness and line width roughness. However, this approach resulted in CD enlargement as the lithographic resist became narrow. In addition, CD controllability deteriorated within inadequate improvement in line edge roughness and line width roughness According to another embodiment of the present disclosure, a method and an apparatus for reducing the critical dimensions for patterning processes with reduction in line edge roughness and line width roughness are provided.

Figure 1:
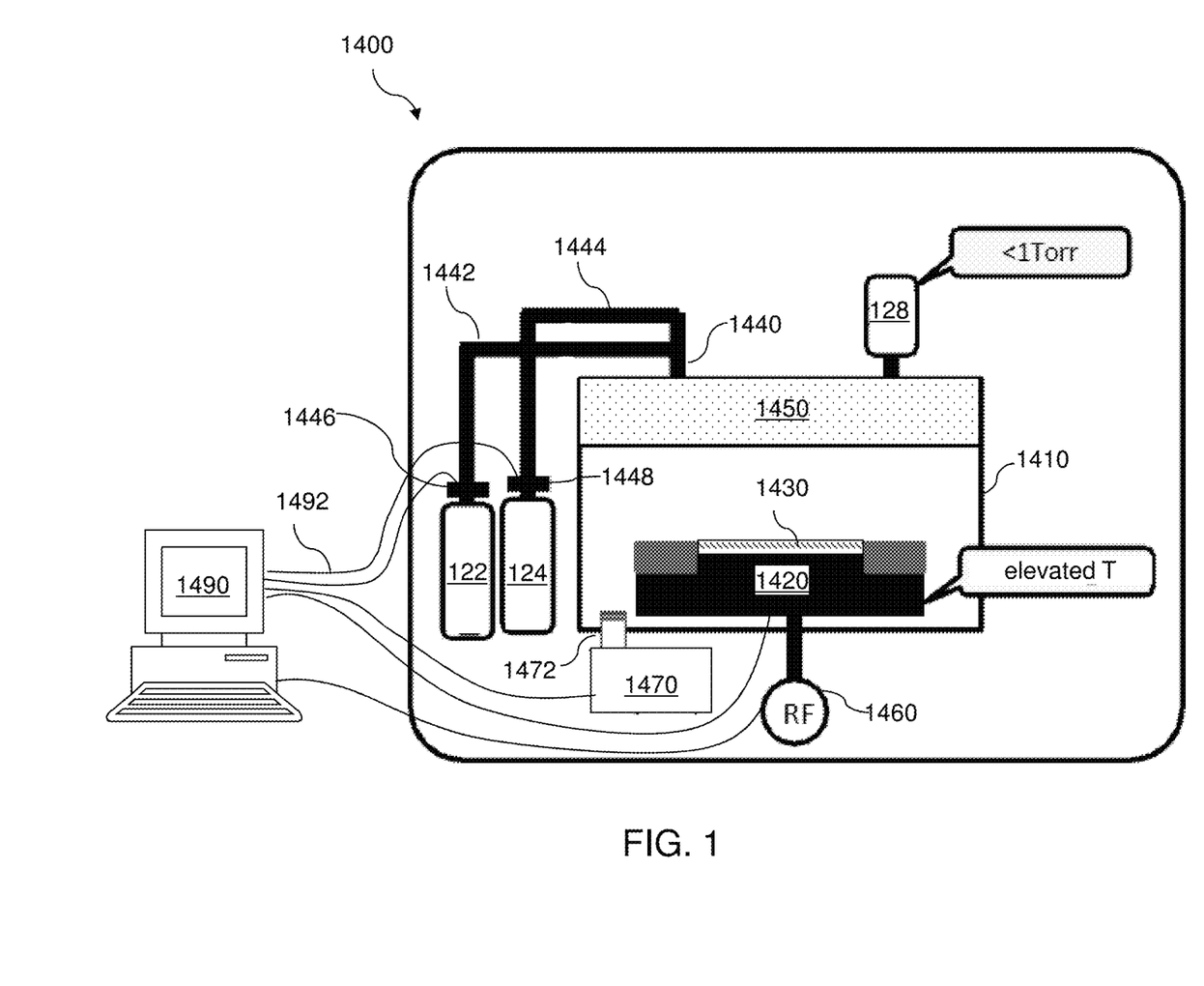
FIG. 1 illustrates a schematic side cross sectional view of a deposition and etching apparatus according to an embodiment of the present disclosure.

Referring to FIG. 1, an in-situ deposition-etch apparatus 1400 may be provided in which a film may be conformally deposited and etched without transfer of a substrate. The in-situ deposition-etch apparatus 1400 comprises a chamber enclosure 1410 which is a vacuum enclosure configure to hold vacuum inside, a chuck 1420 located within the chamber enclosure 1420 and configured to support a substrate 1430 thereupon, and a gas manifold 1440 configured to provide at least one deposition gas (provided from a respective deposition gas supply 122 via gas supply conduit 1442) and at least one etchant gas (provided from a respective etchant gas supply 124 via gas supply conduit 1444) into the chamber enclosure 1410. Gas flow control valves 1446 and 1448 may be located between the gas supplies (e.g., gas storage tanks or cylinders) (122, 124) and the respective gas supply conduits (1442, 1444) or in the respective gas supply conduits (1442, 1444). The chamber enclosure 1410 may be configured to provide loading and unloading of the substrate 1430. The chuck 1420 may be an electrostatic chuck configured to hold the substrate through electrostatic attraction during operation of the plasma in the volume inside the chamber enclosure 1410. Further, an internal heater (not shown) may be provided inside the chuck 1420 to provide heating of the substrate 1430 to an elevated temperature.

A showerhead 1450 may be provided in an upper portion of the chamber enclosure 1410 that faces the substrate 1430 so that the at least one deposition and at least one etchant gas may exit the showerhead 1450 and may be evenly distributed over the substrate 1430. The in-situ deposition-etch apparatus 1400 comprises a radio frequency (RF) electromagnetic field generator 1460 configured to provide a radio frequency electromagnetic field within the chamber enclosure 1410 to provide generation of a plasma of the at least one etchant gas. One node of the RF generator may be electrically connected to the chuck 1420. A vacuum pump 1470 may be connected to the chamber enclosure 1410 through and a vacuum pump manifold 1472. Various sensors may be provided to monitor the temperature, the pressure, and/or the spectrum of the in-situ deposition-etch apparatus 1400. For example, thermocouples (not shown) may be used to monitor the temperature of various parts of the in-situ deposition-etch apparatus 1400, a pressure gauge 128 may be used to monitor the pressure inside the chamber enclosure 1410, and a spectrometer may be used to analyze the optical spectrum generated from the plasma.

Generally, a conformal deposition process may be performed in the in-situ deposition-etch apparatus 1400. The conformal deposition process may use atomic layer deposition (ALD) or chemical vapor deposition (CVD). The at least one deposition gas may include a plurality of deposition gases that may be alternately flowed into the chamber enclosure 1410 for an atomic layer deposition (ALD) process. An ALD process is a deposition process in which at least two process gases are alternately, or sequentially and iteratively, flowed into a process chamber to deposit a compound material layer such as a semiconductor oxide, a semiconductor nitride, a metal oxide, or a metal nitride. In one embodiment, the ALD process may deposit a material layer including a dielectric compound of a semiconductor element such as silicon oxide or silicon nitride. In one embodiment, the ALD process may deposit a material layer including a dielectric compound or a conductive compound of a metal element such as titanium oxide, titanium nitride, aluminum oxide, aluminum nitride, nickel oxide, tungsten oxide, zirconium oxide, hafnium oxide, hafnium nitride, vanadium oxide, and vanadium nitride. In this case, the plurality of deposition gases may include a metallic precursor gas and an agent gas selected from an oxidizing agent gas and a nitriding agent gas. In one embodiment, materials such as $SiO_2$, $TiO_2$, TiN, $TaO_2$, TaN, $Al2O_3$, AlN, HfOx, $ZrO_2$, carbon, Ni, Cu, Co, VO, and VN may be conformally deposited by ALD or CVD at a low process temperature. The low process temperature provides film deposition on a polymer material without problems such as peeling of a fluorocarbon polymer in a process chamber. In one embodiment, the conformal spacer layer may be formed by performing an atomic layer deposition process in which a metallic precursor gas and an agent gas selected from an oxidizing agent gas and a nitriding agent gas are alternately flowed into the chamber enclosure 1410.

In one embodiment, the in-situ deposition-etch apparatus 1400 of the present disclosure may include a controller, such as a computer 1490 loaded with an automated program configured to control flow of the metallic precursor gas and the agent gas and pumping of the chamber enclosure 1410 by actuating the vacuum pump 1470. The automated program actuates alternate flow of the metallic precursor gas and the agent gas into the chamber enclosure 1410 of the in-situ deposition-etch apparatus 1400 from the manifold 1440 through conduits 1442 and 1444 with intermittent pumping of the chamber enclosure 1410 between each temporally neighboring pair of a step for flowing the metallic precursor gas and a step for flowing the agent gas. Thus, the manifold 1440 and/or the conduits 1442 and 1444 comprise a means for providing a sequential etchant gas flow and deposition gas flow comprising an alternate flow of a metallic precursor gas and an oxidizing or nitriding agent gas into the chamber enclosure 1410 with intermittent pumping of the chamber enclosure by the pump 1470 between flowing the metallic precursor gas and flowing the oxidizing or nitriding agent gas.

Signal transmission elements 1492 (such as control signal wires or wireless communication devices) may be provided to transmit control signals and sensor signals between various components of the apparatus 1400 (e.g., the valves (1446, 1448), the RF generator 1460, the pump 1470 and/or the chuck 1420 temperature controller) and the computer 1490. Thus, the controller (e.g., computer) 1490 controls the flow of gases into the chamber enclosure 1410 via the manifold 1440 and/or conduits (1442, 1444) by controlling the operation of the valves (1146, 1448) and the pump 1470 (e.g., by turning them on and off).

According to an embodiment of the present disclosure, the in-situ deposition-etch apparatus 1400 of the present disclosure may be configured to anisotropically etch a material layer on the substrate 1430 in the chamber enclosure 1410. The at least one etchant gas may be any of the etch gases for anisotropic etch processes (such as reactive ion etch processes) known in the art. In one embodiment, the at least one etchant gas may be selected from a fluorocarbon gas, a chlorocarbon gas, and a fluorochlorocarbon gas.

The method and apparatus of the embodiments disclosed in the present disclosure provide in-situ formation of spacers. A deposition step may be performed to form a conformal material layer on a substrate 1430 in the chamber enclosure 1410, and the substrate 1430 may remain in the chamber enclosure 1410 without transfer out of, or into, the chamber enclosure 1410 to allow performance of an etch step that anisotropically etches horizontal portions of the conformal material layer. Each remaining vertical portion of the conformal material layer constitutes a spacer. It is also possible to arbitrarily form a film multiple times, thereby reducing the total processing cost. The method and apparatus of the present disclosure may be used to form a high aspect ratio structure utilizing in-situ formation of spacers provided by a combination of an in-situ conformal deposition process (such as ALD or CVD) and an anisotropic etch process. By forming conformal spacers at a low temperature, it is possible to reduce the critical dimension (CD) of openings without degradation of dispersion or capping margin. Further, the method and apparatus of the present disclosure may improve the roughness of patterned structures and reduce variations in dimensions. The line edge roughness and the line width roughness may be reduced by use of conformal spacers, which reduce surface roughness and random variations in width. The thickness of the spacers may be tightly controlled, and thus, the controllability of CD may be enhanced through the method and apparatus of the present disclosure.

Various precursor gases that may induce deposition of conformal layers may be used in apparatus of the present disclosure, which is a process chamber configured for deposition of a conformal material layer and an anisotropic etch of the conformal material layer. For example, if silicon nitride or silicon oxide is to be deposited, precursor gases such as 3DMAS, 2DMAS, BEMAS, BTBAS, disilane, silane, $SiCl_4$, TCS, DCS, $SiCl_4$, ammonia, $H_2O$, $O_2$, $O_3$, and NO may be used. If titanium oxide or titanium nitride is to be deposited, TDMAT, TDEAT, $TiCl_4$ may be used in conjunction with an oxygen source gas or a nitrogen source gas. If nickel oxide is to be deposited, Cp2Ni, MeCp2Ni, EtCp2Ni, or i-PrCp2Ni may be used in conjunction with an oxygen source gas. If tungsten oxide is to be deposited, $WF_6$, $WCl_6$, or $(Me_2N)_3W-W(NMe_2)_3$ may be used in conjunction with an oxygen source. If zirconium oxide is to be deposited, TDMAZr, TDEAZr, or TEMAZr may be used in conjunction with an oxygen source. If hafnium oxide or hafnium nitride is to be deposited, TDMAHf, TDEAHf, or TEMAHf may be used in conjunction with an oxygen source or a nitrogen source. If vanadium oxide or vanadium nitride is to be deposited, $VO(i-OPr)_3$ or $VOCl_3$ may be used in conjunction with an oxygen source or a nitrogen source.

A patterned structure, such as an in-process three-dimensional memory device, may be loaded on a chuck, which may be an electrostatic chuck (ESC), into the chamber enclosure. The deposition process may comprise chemical vapor deposition or atomic layer deposition, which deposits a conformal film on the patterned structure. The chamber enclosure of the present disclosure may use a precursor gas that may induce deposition of a conformal thin film at a low temperature, which may be less than 500 degrees Celsius, such as less than 400 degrees Celsius, and/or less than 300 degrees Celsius, and/or less than 200 degrees Celsius, and/or less than 100 degrees Celsius. The precursor gas and any additional process gas (such as an oxygen source gas or a nitrogen source gas) may be flowed into the chamber enclosure of the chamber enclosure through a gas manifold including mass flow controllers. A gas inlet may be provided between the gas manifold and the chamber enclosure. In one embodiment, the gas inlet may comprise a showerhead configured to uniformly provide the precursor gas and the additional process gas. In some embodiments, a bubbler may be used to provide a precursor gas from a precursor material in a liquid phase and having a low vapor pressure at room temperature. The pressure of the in-situ deposition chamber may be less than 1 Torr, such as less than 200 mTorr during the deposition process. The pressure inside the chamber enclosure may be maintained by a pumping system, which may use, for example, a combination of a dry pump and a turbo pump.

In one embodiment, the in-situ deposition-etch apparatus of the present disclosure may comprise: a chamber enclosure; a chuck (such as an electrostatic chuck) configured to load a substrate thereupon and located within the chamber enclosure; a gas manifold configured to provide at least one deposition gas and at least one etchant into the chamber enclosure; a radio frequency (RF) electromagnetic field generator configured to provide a radio frequency electromagnetic field within the chamber enclosure; and a vacuum pump and a vacuum pump manifold connecting the vacuum pump to the chamber enclosure.

Figure 2A:
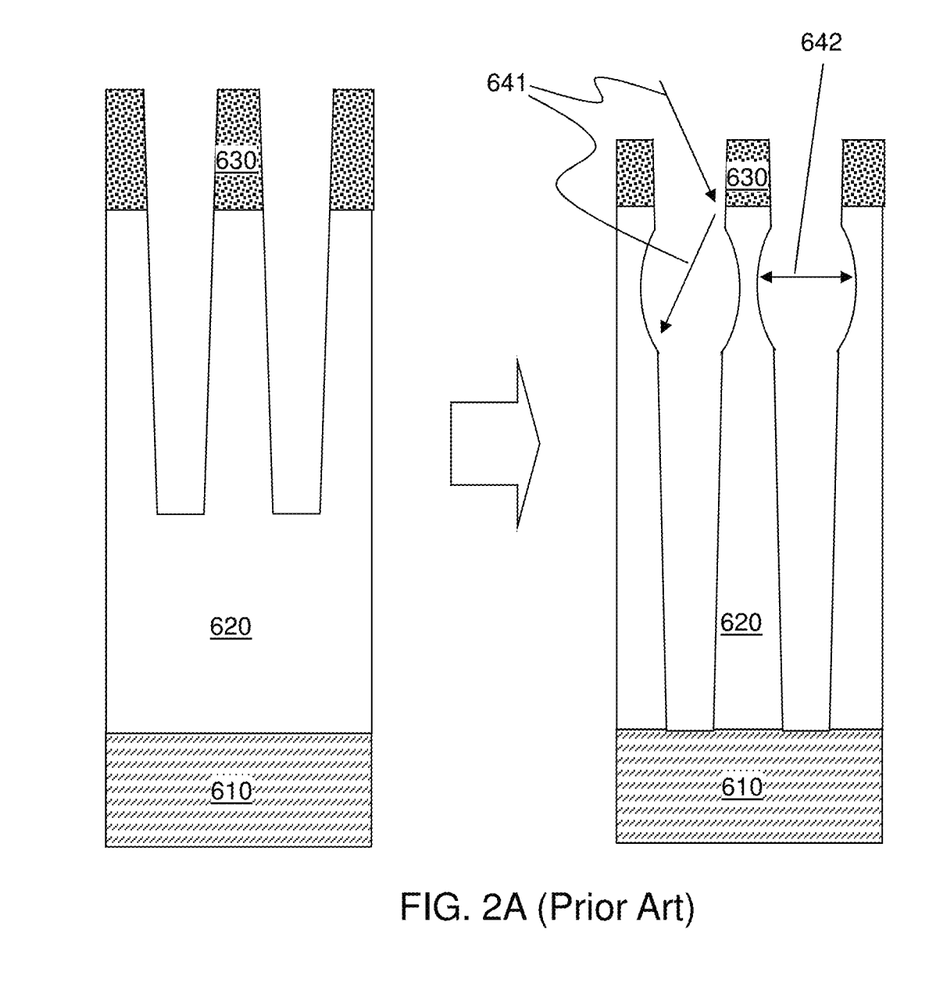
FIG. 2A illustrates a first prior art method for forming deep openings through a material layer.

FIG. 2A illustrates a first prior art method for forming deep openings through a first material layer 630 formed over a second material layer 620 all formed over a substrate 610. In situations in which a carbon mask 630 is used without any modification as an etch mask layer, ion scattering may cause collateral isotropic etch of sidewalls of upper portions of high aspect ratio openings through a material layer. Ions 641 reflected off sidewalls of the carbon mask 630 can induce widening of upper portions of via cavities. Thus, a bulging portion 642 can be formed underneath the carbon mask 630, thereby producing local widening of the via cavities. Thus, the chemical isotropic etch component and scattered ions of the anisotropic etch process widens the dimensions of openings at upper ends of the material layer, resulting a non-vertical profile and insufficient separation among the openings at an upper portion of the material layer.

Figure 2B:
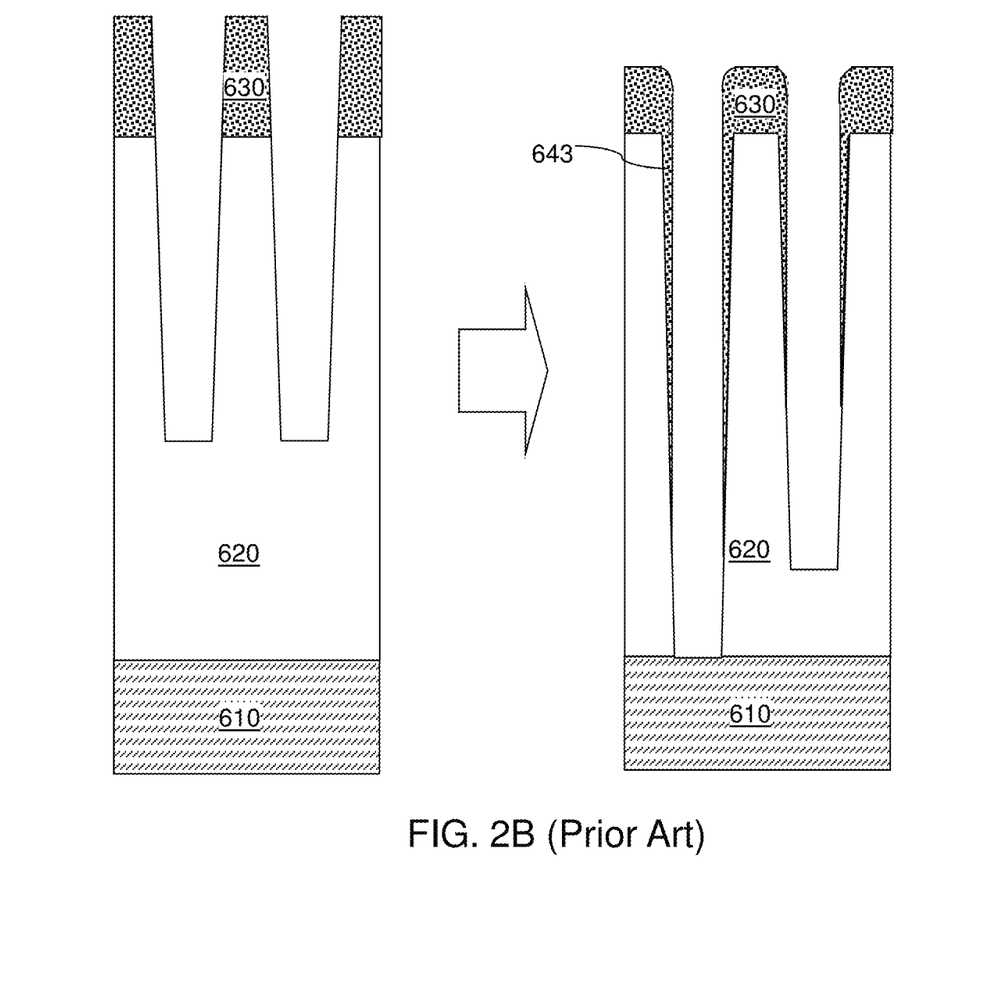
FIG. 2B illustrates a second prior art method for forming deep openings through a material layer.

Referring to FIG. 2B, a second prior art method for forming deep openings through a material layer 620. In this case, an anisotropic etch chemistry generates viscous fluorocarbon polymers that coats upper portions of sidewalls 643 of high aspect ratio openings. The generation and flow of the fluorocarbon polymers is non-uniform and random, and thus, variations in depth and lateral dimensions of the high aspect ratio openings result. The resulting structure has lateral width variations and vertical depth variations among the high aspect ratio openings. Thus, while use of the fluorocarbon may reduce the lateral dimensions of the openings in an underlying material layer, capping margin decreases due to low step coverage and random variations in the depths of the openings.

Figure 3:
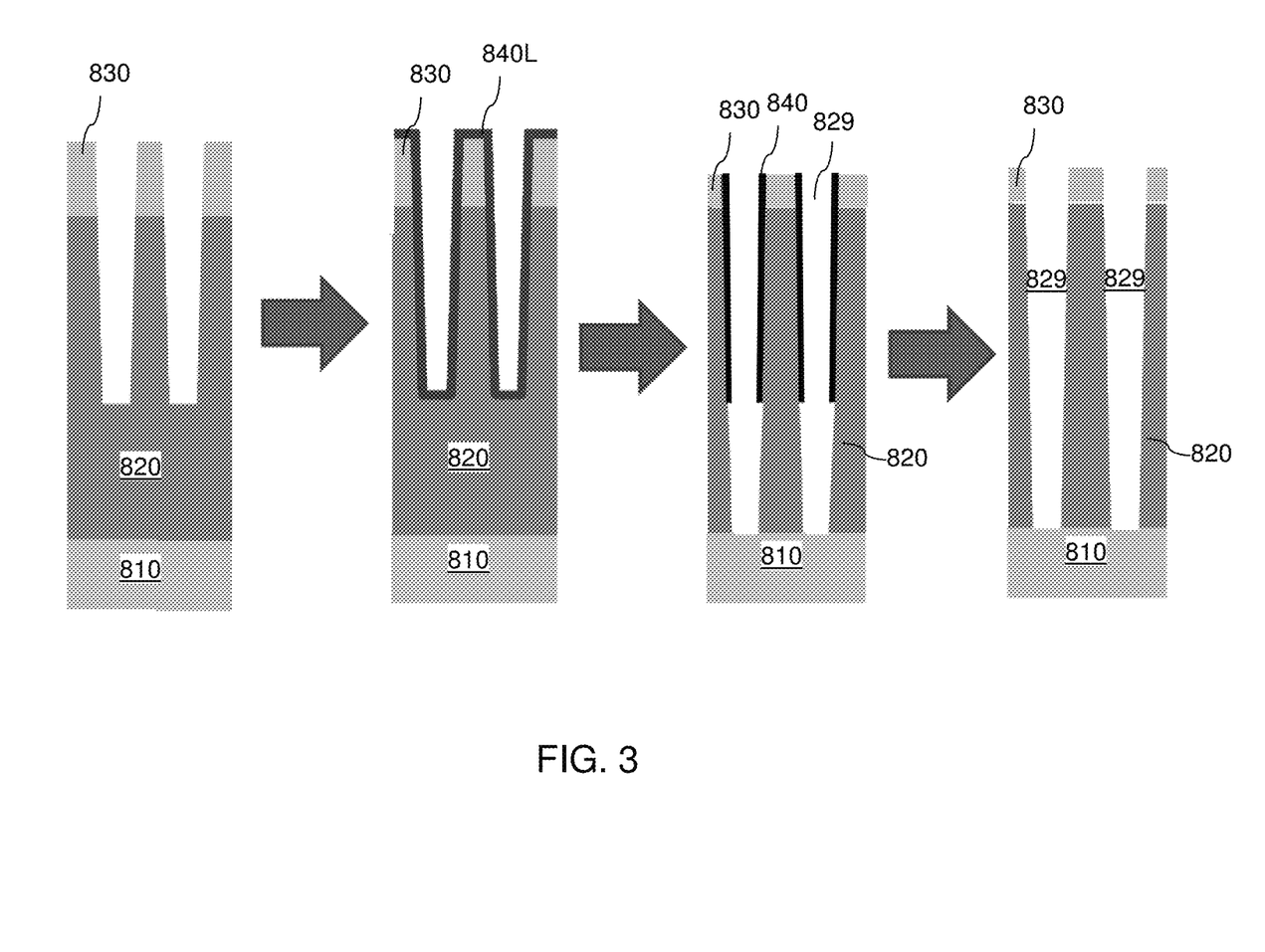
FIG. 3 illustrates processing steps that may be used to pattern a first exemplary structure according to an embodiment of the present disclosure.

Referring to FIG. 3, a first exemplary structure that may be formed using an embodiment in-situ deposition-etch apparatus 1400 of the present disclosure is illustrated. A first material layer 820 and a second material layer 830 may be sequentially deposited over a substrate 810. The first material layer 820 may be any material layer or a stack of material layers through which at least one cavity is to be subsequently formed. For example, the first material layer 820 may be the alternating stack of insulating material layers and spacer material layers or dielectric fill material portion that may be used to manufacture a three-dimensional memory device include a two-dimensional array of vertical NAND strings. The first material layer 820 may include a semiconductor material layer, a silicon oxide layer, a silicon nitride layer, or a stack including at least one silicon oxide layer and at least one silicon nitride layer.

The second material layer 830 may include a material different from the material of the first material layer 820. The second material layer 830 may be a material that may be used as a hard mask material. The second material layer 830 may include a carbon-based material such as amorphous carbon or diamond-like carbon (DLC), polysilicon, silicon nitride, silicon oxide, or a dielectric metal oxide. In one embodiment, the second material layer 830 may be formed as a blanket (unpatterned) carbon mask layer. A photoresist layer (not shown) may be applied over the second material layer 830, and may be lithographically patterned to form at least one opening therein. The pattern in the photoresist layer may include a line and space pattern, and/or discrete openings in a continuous photoresist layer, and/or discrete patterned portions of a photoresist material.

The structure including the substrate 810, the first material layer 820, and the second material layer 830 may be transferred into the chamber enclosure 1410 of the in-situ deposition-etch apparatus 1400. The substrate 1430 of FIG. 1 corresponds to the structure including the substrate 810, the first material layer 820, and the second material layer 830. The chamber enclosure 1410 may be sealed in a vacuum environment, and a first anisotropic etch process may be performed in an embodiment in-situ deposition-etch apparatus 1400. A patterned second material layer 830 may be formed by transferring the pattern in the photoresist layer through the second material layer 830 by performing the first anisotropic etch process. In one embodiment, the patterned second material layer 830 may be a patterned carbon mask layer.

A second anisotropic etch process may be performed to transfer the pattern in the patterned second material layer 830 into an upper portion of the first material layer 820. The patterned second material layer 830 may be used as an etch mask layer during the second anisotropic etch process. In-process cavities may be formed in the upper portion of the first material layer 820. The photoresist layer may be collaterally consumed during the second anisotropic etch process.

A conformal spacer layer 840L may be deposited by chemical vapor deposition or atomic layer deposition within the chamber enclosure 1410 of an embodiment in-situ deposition-etch apparatus 1400 after the first anisotropic etch process and the second anisotropic etch process according to an embodiment of the present disclosure. The structure including the substrate 810, the first material layer 820, and the second material layer 830 may remain in the chamber enclosure 1410 on the chuck 1420 throughout the first anisotropic etch process and the deposition process that forms the conformal spacer layer 840L. The conformal spacer layer 840L may be formed over the patterned second material layer 830 and on the physically exposed portions of the top surface of the first material layer 820 within the chamber enclosure 1410 of the in-situ deposition-etch apparatus 1400. The conformal spacer layer 840L may include a material that may provide a higher etch resistance than the material of the first material layer 820 during a subsequent etch step that etches the material of the first material layer 820. For example, the conformal spacer layer 840L may include a dielectric metal oxide material, silicon nitride, silicon oxide, amorphous carbon, a semiconductor material, or a polymer material.

In one embodiment, the conformal spacer layer 840L may be formed by performing an atomic layer deposition process in which a metallic precursor gas and an agent gas selected from an oxidizing agent gas and a nitriding agent gas are alternately flowed into the chamber enclosure 1410 of the in-situ deposition-etch apparatus 1400. In one embodiment, conformal spacer layer 840L comprises a material selected from silicon oxide or silicon nitride. In one embodiment, the conformal spacer layer 840L may comprise a material selected from titanium oxide, titanium nitride, aluminum oxide, aluminum nitride, nickel oxide, tungsten oxide, zirconium oxide, hafnium oxide, hafnium nitride, vanadium oxide, vanadium nitride or carbon. In one embodiment, the first material layer 820 comprises a silicon oxide material such as a doped silicate glass, undoped silicate glass, or organosilicate glass. In one embodiment, the first material layer 820 may comprise a carbon-based material including carbon atoms at an atomic concentration greater than 50%. In one embodiment, the first material layer 820 may consist essentially of amorphous carbon, and may be used as an etch mask layer in a subsequent etch process that transfers the pattern of the first material layer 820 into an upper portion of the substrate 810.

A first etch step of a third anisotropic etch process may be performed to etch through the horizontal portions of the conformal spacer layer 840L. Spacer films 840 may be formed on sidewalls of the patterned second material layer 830 and over unrecessed horizontal top surfaces of the first material layer 820. The spacer films 840 may include remaining vertical portions of the conformal spacer layer 840L after the first etch step of the third anisotropic etch process. A second etch step of the third anisotropic etch process may be performed using the combination of the patterned second material layer 830 and the spacer films 840 as an etch mask. The chemistry of the second etch step of the third anisotropic etch process may be changed so that the material of the first material layer 820 may be etched selective to the materials of the second material layer 830 and the spacer films 840. The second etch step of the third anisotropic etch process may etch through the first material layer 820 to form cavities 829 that extend from a top surface of the substrate 810 at least to a top surface of the first material layer 820. Generally, portions of the first material layer 820 located between the substrate 810 and bottom surfaces of the spacer films 840 may be anisotropically etched using a combination of the patterned second material layer 830 and the spacer films 840 as an etch mask in the in-situ deposition-etch apparatus 1400.

Alternatively, deposition of a conformal spacer layer and a subsequent anisotropic etch process may be repeated at least once more until the in-process cavities extend to a target depth or to the top surface of the substrate 810. In one embodiment, any remaining portions of the spacer films 840 may be subsequently removed in-situ by ashing if the spacer films 840 are made of a carbon material. Alternatively, the structure including the substrate 810, the first material layer 820, the second material layer 830, and any remaining portions of the spacer films 840 may be subsequently removed out of the in-situ deposition-etch apparatus 1400, and the remaining portions of the spacer films 840 may be removed by dissolution in a solvent. The patterned second material layer 830 may, or may not, be subsequently removed. If removal of the patterned second material layer 830 is desired, the patterned second material layer 830 may be removed in-situ, for example, by ashing, or ex-situ, for example, by removing the structure including the substrate 810, the first material layer 820, and the second material layer 830 out of the in-situ deposition-etch apparatus 1400.

The spacer films 840 may reduce the lateral dimensions (such as critical dimensions) of the cavities 829 while improving the capping margin and reducing the depth variations of the cavities 829 in the first material layer 820.

The combination of the substrate 810, the first material layer 820, the second material layer 830 may remain in the chamber enclosure 1410 of the in-situ deposition-etch apparatus 1400 at least from the processing step for depositing the conformal spacer layer 840L at least to the processing step for anisotropically etching the portions of the first material layer 820 located between the substrate 810 and bottom surfaces of the spacer films 840. In one embodiment, the combination of the substrate 810, the first material layer 820, the second material layer 830 remain in the in-situ deposition-etch apparatus 1400 from the processing step for the first anisotropic etch process to the processing step for anisotropically etching the portions of the first material layer 820 located between the substrate 810 and bottom surfaces of the spacer films 840.

In one embodiment, at least a portion of the spacer films 840 may remain on sidewalls of the first material layer 820 after top surfaces of the substrate 810 are physically exposed. In one embodiment, remaining portions of the spacer films 840 may be removed from the sidewalls of the first material layer 820 selective to the material of the first material layer 820 after the top surfaces of the substrate 810 are physically exposed.

Figure 4A:
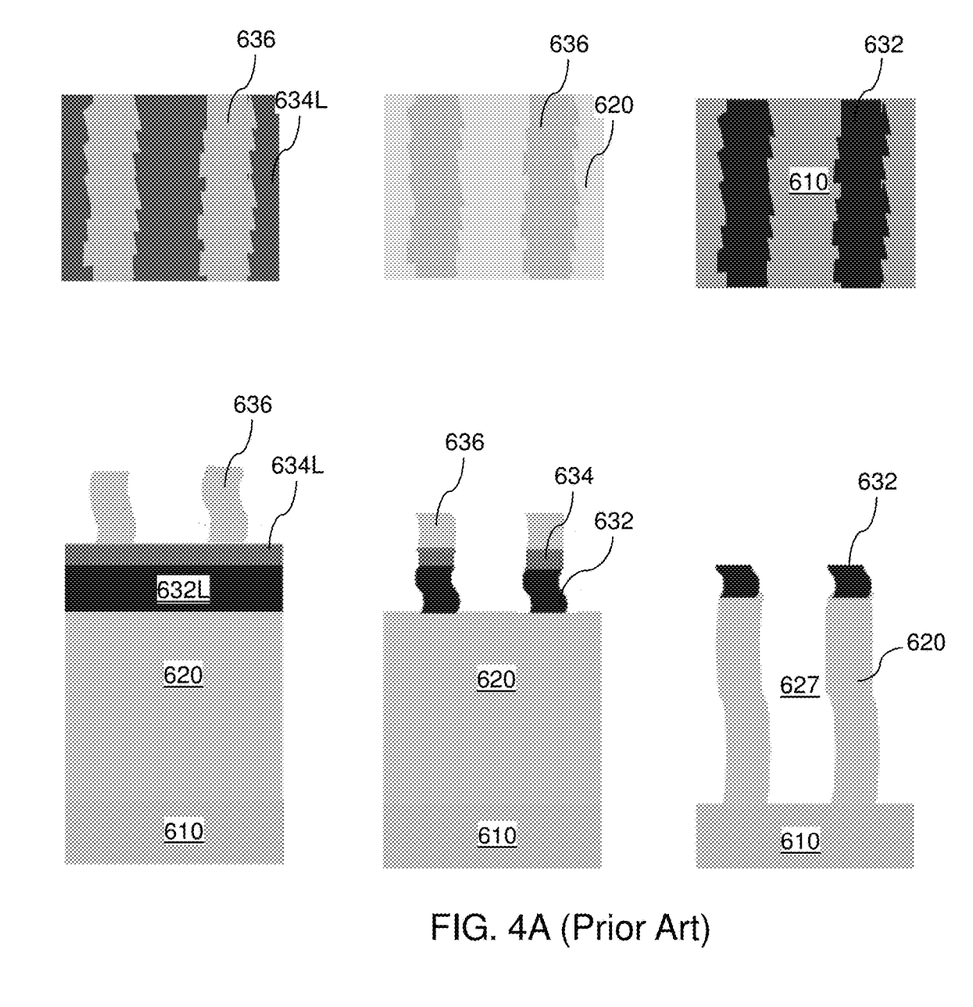
FIG. 4A illustrates a first prior art method for patterning a material layer.

Referring to FIG. 4A, a first prior art method for patterning a carbon mask layer is illustrated. Vertical cross sectional views with corresponding top down views are provided. A stack of a carbon layer 620, a hard mask layer 632L (such as a silicon oxide layer, a silicon nitride layer, or a dielectric metal oxide layer), an optional bottom anti-reflective coating (BARC) layer 634L, and a photoresist layer 636 may be applied over a material layer 610 to be subsequently etched. The photoresist layer 636 may be lithographically exposed in a lithography tool. In situations in which the dimensions of patterns in the patterned photoresist layer 636 approaches the critical dimension (i.e., the minimum printable dimension) for the combination of the photoresist material and the lithography tool used to lithographically expose the photoresist material, line width roughness in the patterned photoresist layer 636 may be significant. Transfer of the pattern into the BARC layer 634L and the hard mask layer 632L, and subsequently through the carbon layer 620, may lead to significant line width roughness in the carbon layer 620. Deformations in the patterned BARC portions 634 and patterned hard mask portions 632 contribute to the line edge roughness on the sidewalls of the patterned carbon layer 620 between line cavities 627. Transfer of the pattern in such a carbon layer 620 into the underlying material layer result in formation of a poor quality pattern in the underlying material layer. The line edge roughness and line width roughness of the carbon layer and the underlying material layer may be high.

Figure 4B:
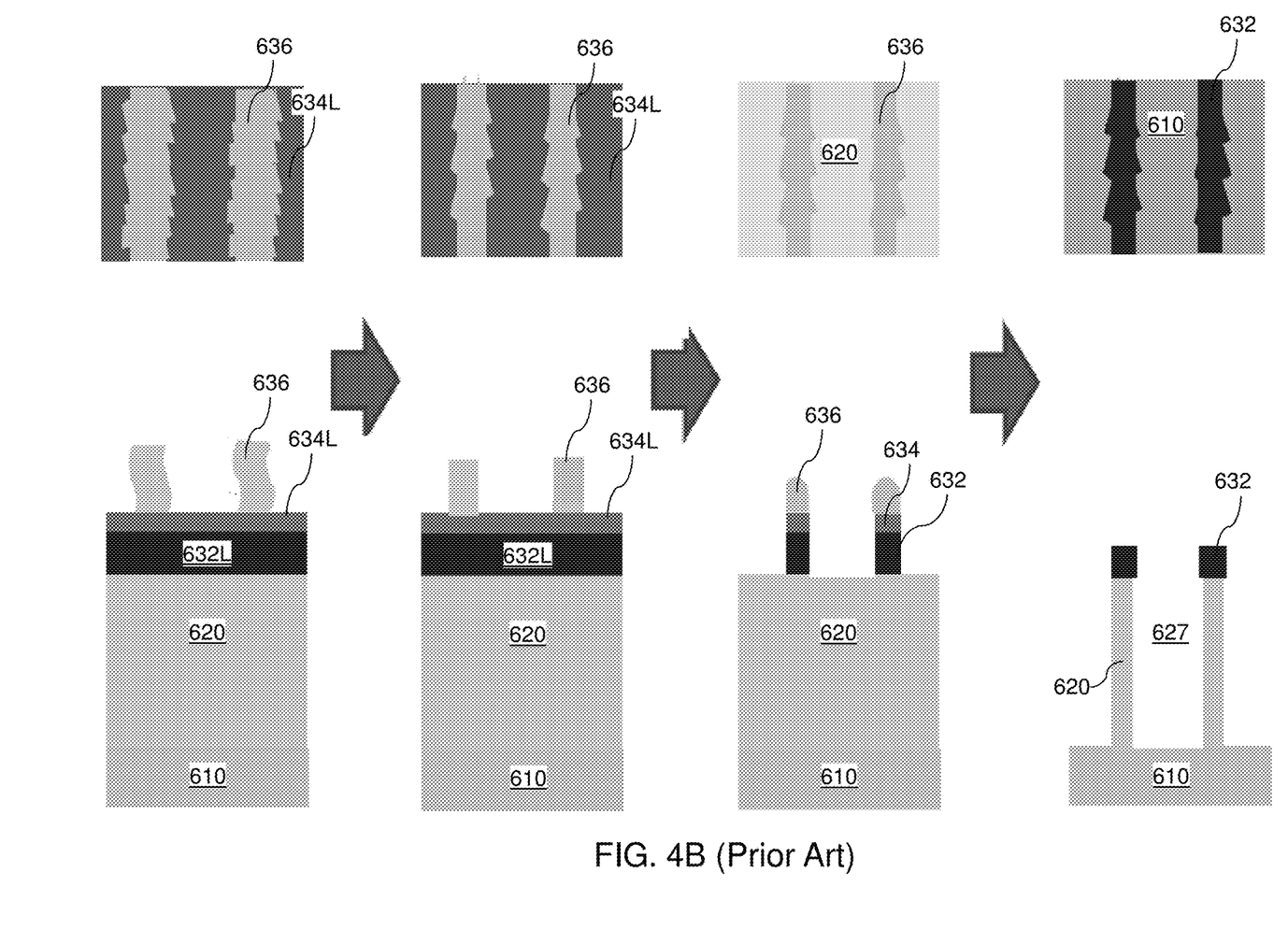
FIG. 4B illustrates a second prior art method for patterning a material layer.

Referring to FIG. 4B, a second prior art method for patterning a carbon mask layer is illustrated. Vertical cross sectional views with corresponding top down views are provided. The second prior art method is derived from the first prior art method by employing a resist trimming method. As the resist is trimmed, the critical dimension of the openings increases. The resulting pattern in the carbon layer has a wider critical dimension (i.e., a wider distance between patterned carbon material portions) than the pattern of FIG. 4A without significant decrease in the line width roughness. The resist trimming technique caused wide critical dimension variations due to resist shrink.

Figure 5A:
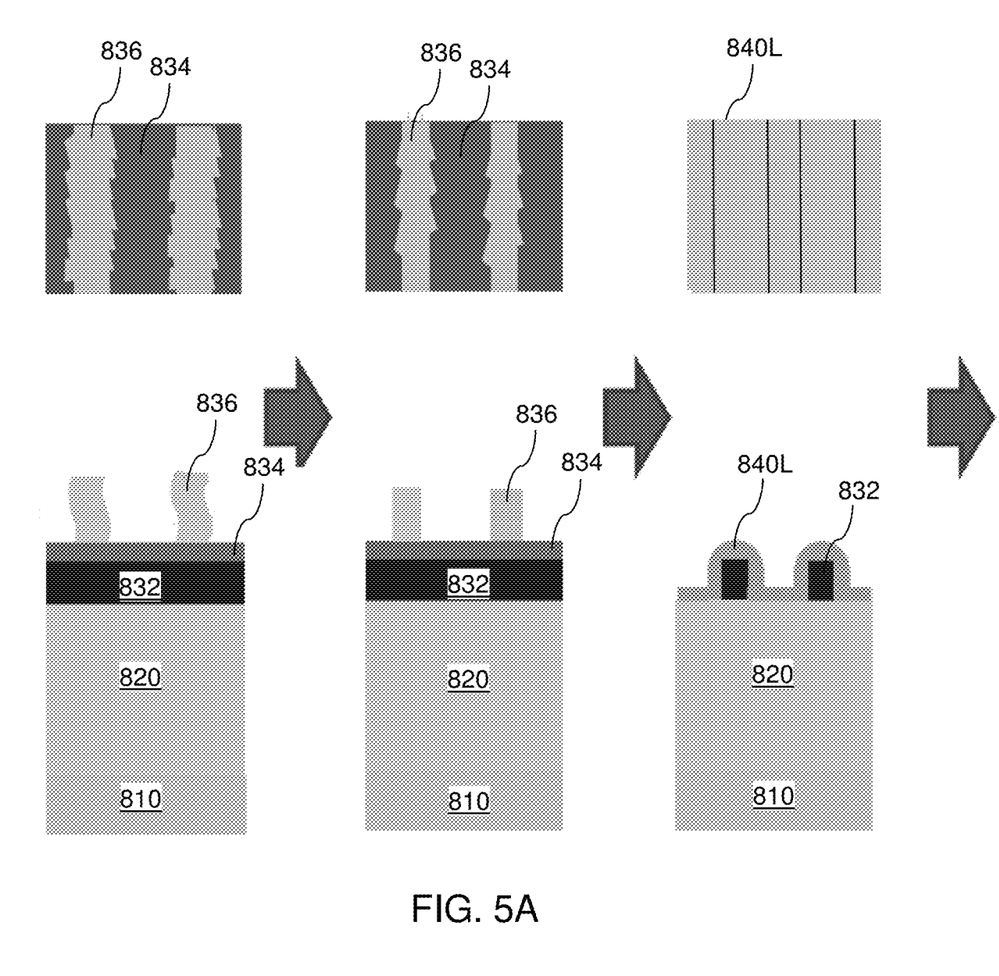
FIG. 5A illustrates a first set of processing steps that may be used to pattern a second exemplary structure according to an embodiment of the present disclosure.
Figure 5B:
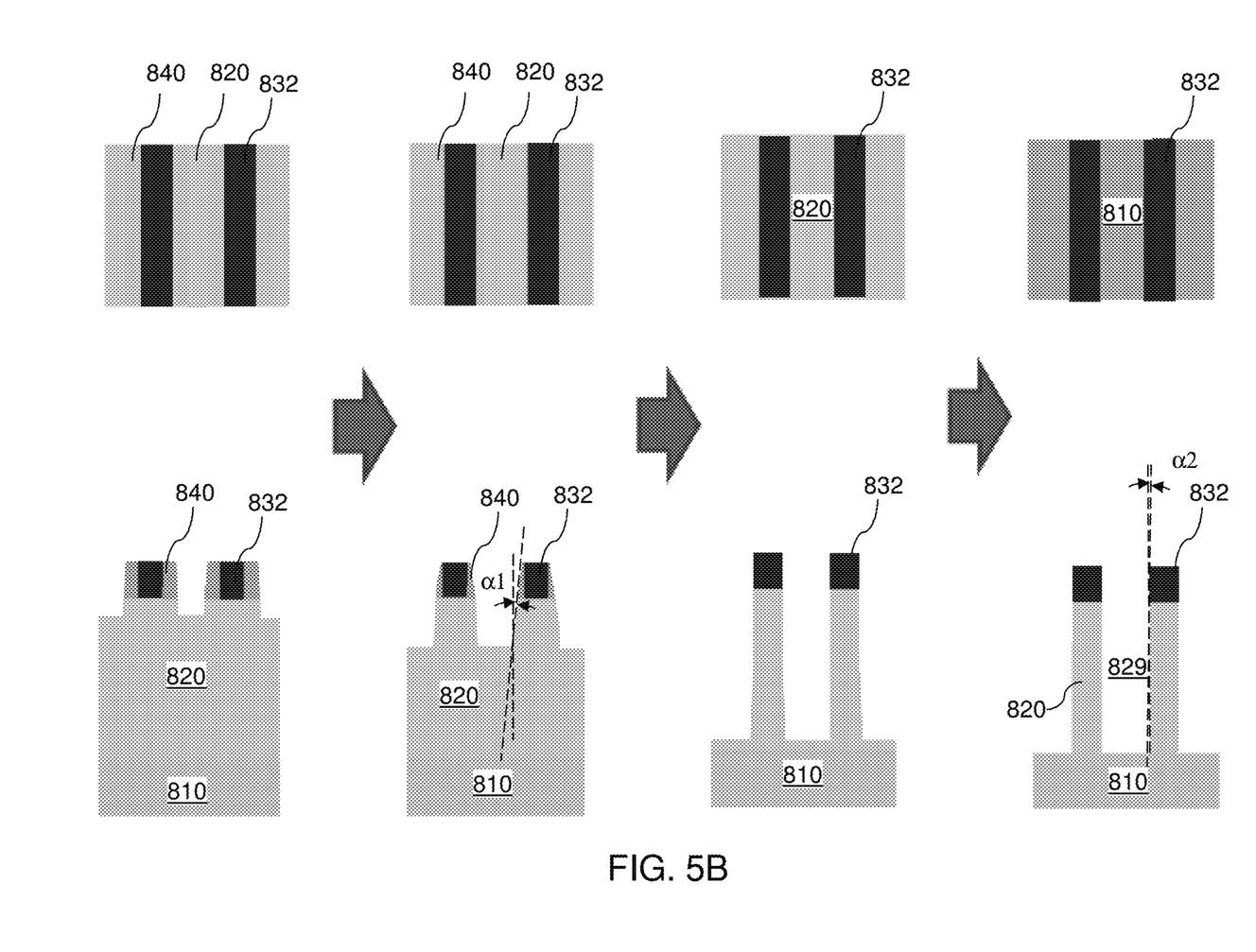
FIG. 5B illustrates a second set of processing steps that may be used to pattern the second exemplary structure according to an embodiment of the present disclosure.

Referring to FIGS. 5A and 5B, a second exemplary structure that may be formed using the in-situ deposition-etch apparatus 1400 of the present disclosure is illustrated. A first material layer 820 and a second material layer 832 may be sequentially deposited over a substrate 810. The first material layer 820 may be any material layer or a stack of material layers through which at least one cavity may be subsequently formed. For example, the first material layer 820 may be the alternating stack of insulating material layers and spacer material layers or dielectric fill material portion that may be used to manufacture a three-dimensional memory device include a two-dimensional array of vertical NAND strings. The first material layer 820 may include a semiconductor material layer, a silicon oxide layer, a silicon nitride layer, or a stack including at least one silicon oxide layer and at least one silicon nitride layer. In one embodiment, the first material layer 820 may include, and/or consist essentially of, carbon. For example, the first material layer 820 may be an amorphous carbon layer or a diamond-like carbon (DLC) layer.

The second material layer 832 may include a material different from the material of the first material layer 820. In one embodiment, the second material layer 832 may be a material that may be used as a hard mask material. The second material layer 832 may include a hard mask material such as polysilicon, silicon nitride, silicon oxide, or a dielectric metal oxide. In one embodiment, the second material layer 832 may be formed as a blanket dielectric material layer or a blanket semiconductor material layer.

A bottom anti-reflective coating (BARC) layer 834 may be applied over the second material layer 832. A photoresist layer 836 may be applied over the BARC layer 834, and may be lithographically patterned to form at least one opening therein. The pattern in the photoresist layer may include a line and space pattern, and/or discrete openings in a continuous photoresist layer, and/or discrete patterned portions of a photoresist material. While a line and space pattern illustrated in FIG. 5A, various other lithographic patterns may also be used. The patterned photoresist layer may have lateral dimensions on the order of, or less than 30 nm, for example, in width and/or in spacing. Nanoscale roughness is present in the sidewalls of the patterned photoresist layer. Further, distortions of the patterned portions of the photoresist layer may be present. The edge roughness of the sidewalls of patterned portions of the photoresist layer 836 is illustrated in a top-down view in FIG. 5A. In case the pattern in the photoresist layer 836 is a line and space pattern, the edge roughness of the sidewalls of the patterned portions of the photoresist layer 836 is referred to as line edge roughness. Distortions in the sidewalls of the patterned portions of the photoresist layer 836 are illustrated in a vertical cross-sectional view in FIG. 5A.

The structure including the substrate 810, the first material layer 820, the second material layer 832, the BARC layer 834, and the patterned photoresist layer 836 may be transferred into the chamber enclosure 1410 of the in-situ deposition-etch apparatus 1400. The substrate 1430 of FIG. 1 corresponds to the structure including the substrate 810, the first material layer 820, the second material layer 832, the BARC layer 834, and the patterned photoresist layer 836. The chamber enclosure 1410 may be sealed in a vacuum environment, and a photoresist trimming process may be optionally performed. The photoresist trimming process has the collateral effect of reducing the line width or the feature dimensions (such as a diameter or a width of each patterned portion) of the patterned photoresist layer 836, while reducing the edge roughness of the patterned photoresist layer 836 and reducing the distortions in the sidewalls of the patterned photoresist layer 836.

A first anisotropic etch process may be performed in the in-situ deposition-etch apparatus 1400. The pattern in the photoresist layer 836 is transferred through the BARC layer 834 and through the second material layer 832 by the first anisotropic etch process. A patterned second material layer 832 may be formed by transferring the pattern in the photoresist layer through the second material layer 830 by performing the first anisotropic etch process. In one embodiment, the patterned second material layer 832 may be a patterned hard mask layer. The BARC layer 834 may be collaterally consumed during the first anisotropic etch process.

In one embodiment, the first anisotropic etch process etches the material of the second material layer 832 selective to the material of the first material layer 820. Thus, the collateral etching of the first material layer 820 after the first anisotropic etch process may be negligible or zero. In one embodiment, the physically exposed horizontal surface of the first material layer 820 may be vertically spaced from the top surface of the substrate 810 by at least 95%, such as at least 99%, of the vertical thickness of the first material layer 810 prior to the first anisotropic etch process, i.e., the full thickness of the first material layer 810.

A conformal spacer layer 840L may be deposited by chemical vapor deposition or atomic layer deposition within the chamber enclosure 1410 of the in-situ deposition-etch apparatus 1400 after the first anisotropic etch process according to an embodiment of the present disclosure. The structure including the substrate 810, the first material layer 820, and the second material layer 832 remains in the chamber enclosure 1410 on the chuck 1420 throughout the first anisotropic etch process, the second anisotropic etch process, and the deposition process that forms the conformal spacer layer 840L. The conformal spacer layer 840L is formed over the patterned second material layer 832 and on the sidewalls and the bottom surfaces of the in-process cavities in the upper portion of the first material layer 820 within the chamber enclosure 1410 of the in-situ deposition-etch apparatus 1400. The conformal spacer layer 840L includes a material that may provide a higher etch resistance than the material of the first material layer 820 during a subsequent etch step that etches the material of the first material layer 820. For example, the conformal spacer layer 840L may include a dielectric metal oxide material, silicon nitride, silicon oxide, amorphous carbon, a semiconductor material, or a polymer material.

In one embodiment, the conformal spacer layer 840L may be formed by performing an atomic layer deposition process in which a metallic precursor gas and an agent gas selected from an oxidizing agent gas and a nitriding agent gas are alternately flowed into the chamber enclosure 1410 of the in-situ deposition-etch apparatus 1400. In one embodiment, conformal spacer layer 840L comprises a material selected from silicon oxide, and silicon nitride. In one embodiment, the conformal spacer layer 840L comprises a material selected from titanium oxide, titanium nitride, aluminum oxide, aluminum nitride, nickel oxide, tungsten oxide, zirconium oxide, hafnium oxide, hafnium nitride, vanadium oxide, and vanadium nitride. In one embodiment, the first material layer comprises a silicon oxide material such as a doped silicate glass, undoped silicate glass, or organosilicate glass. In one embodiment, the first material layer 820 comprises a carbon-based material including carbon atoms at an atomic concentration greater than 50%. In one embodiment, the first material layer 820 may consist essentially of amorphous carbon, and may be used as an etch mask layer in a subsequent etch process that transfers the pattern of the first material layer 820 into an upper portion of the substrate 810.

A first etch step of a second anisotropic etch process is performed to etch through the horizontal portions of the conformal spacer layer 840L. Spacer films 840 are formed on sidewalls of the patterned second material layer 832 and on sidewalls of the in-process cavities in the upper portion of the first material layer 820. The spacer films 840 include remaining vertical portions of the conformal spacer layer 840L after the first etch step of the second anisotropic etch process. A second etch step of the second anisotropic etch process is performed using the combination of the patterned second material layer 832 and the spacer films 840 as an etch mask. The chemistry of the second etch step of the second anisotropic etch process may be changed so that the material of the first material layer 820 is etched selective to the materials of the second material layer 832 and the spacer films 840. The second etch step of the second anisotropic etch process may etch through the lower portion of the first material layer 820 to form cavities 829 that extend from a top surface of the substrate 810 at least to a top surface of the first material layer 820. Generally, portions of the first material layer 820 located between the substrate 810 and bottom surfaces of the spacer films 840 may be anisotropically etched using a combination of the patterned second material layer 832 and the spacer films 840 as an etch mask in the in-situ deposition-etch apparatus 1400.

Alternatively, deposition of a conformal spacer layer and a subsequent anisotropic etch process may be repeated at least once more until the in-process cavities extend to a target depth or to the top surface of the substrate 810. In one embodiment, any remaining portions of the spacer films 840 may be subsequently removed in-situ by ashing. Alternatively, the structure including the substrate 810, the first material layer 820, the second material layer 832, and any remaining portions of the spacer films 840 may be subsequently removed out of the in-situ deposition-etch apparatus 1400, and the remaining portions of the spacer films 840 may be removed by dissolution in a solvent. The patterned second material layer 832 may, or may not, be subsequently removed. If removal of the patterned second material layer 832 is desired, the patterned second material layer 832 may be removed in-situ, for example, by ashing, or ex-situ, for example, by removing the structure including the substrate 810, the first material layer 820, and the second material layer 832 out of the in-situ deposition-etch apparatus 1400.

The spacer films 840 may reduce the lateral dimensions (such as critical dimensions) of the cavities 829 while improving the capping margin and reducing the depth variations of the cavities 829 in the first material layer 820.

The combination of the substrate 810, the first material layer 820, the second material layer 832 may remain in the chamber enclosure 1410 of the in-situ deposition-etch apparatus 1400 at least from the processing step for depositing the conformal spacer layer 840L at least to the processing step for anisotropically etching the portions of the first material layer 820 located between the substrate 810 and bottom surfaces of the spacer films 840. In one embodiment, the combination of the substrate 810, the first material layer 820, the second material layer 832 remain in the in-situ deposition-etch apparatus 1400 from the processing step for the first anisotropic etch process to the processing step for anisotropically etching the portions of the first material layer 820 located between the substrate 810 and bottom surfaces of the spacer films 840.

In one embodiment, the lateral thickness of the spacer films 840 may gradually decrease during the second anisotropic etch process that anisotropically etches the portions of the first material layer located between the substrate 810 and bottom surfaces of the spacer films 840. In one embodiment, the spacer films 840 may be completely consumed during the second anisotropic etch process.

In one embodiment, in-process cavities formed during the second anisotropic etch process in the first material layer 820 may have tapered surfaces have a first taper angle $\alpha 1$, which may be measured after etching through 10% of the total thickness of the first material layer 820. cavities 829 formed after the second anisotropic etch process in the first material layer 820 may have a second taper angle $\alpha 2$ that is less than the first taper angle $\alpha 1$. In one embodiment, the first taper angle $\alpha 1$ may be greater than the second taper angle $\alpha 2$ by a difference in a range from 1 degree to 10 degrees. For example, the first taper angle $\alpha 1$ may be in a range from 1 degree to 15 degrees, and the second taper angle $\alpha 2$ may be in a range from 0 degree to 1 degree.

Generally, the combination of a conformal spacer layer deposition and in-situ anisotropic etch of the conformal spacer layer for forming spacer films provides formation of a pattern having low line edge roughness, low line width roughness, and controlled critical dimensions (i.e., lateral dimensions of openings that are not enlarged during pattern transfer processes). The in-situ deposition-etch apparatus of the present disclosure may be used to form any of the patterns used to form the three-dimensional memory device described above including, but not limited to, patterns for arrays of openings through layer stacks, patterns of via cavities, and patterns for any of the interconnect structures.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of patterning a structure, comprising:
   forming a first material layer, a second material layer, and a photoresist layer over a substrate;
   lithographically patterning the photoresist layer;
   forming a patterned second material layer by transferring a pattern in the photoresist layer through the second material layer using a first anisotropic etch process;
   depositing a conformal spacer layer over the patterned second material layer in a chamber enclosure of an in-situ deposition-etch apparatus;
   forming spacer films by anisotropically etching the conformal spacer layer in the chamber enclosure of the in-situ deposition-etch apparatus; and
   anisotropically etching portions of the first material layer located between the substrate and bottom surfaces of the spacer films using a combination of the patterned second material layer and the spacer films as an etch mask in the in-situ deposition-etch apparatus.

2. The method of claim 1, wherein a combination of the substrate, the first material layer, and the second material layer remain in the in-situ deposition-etch apparatus from a processing step for depositing the conformal spacer layer to a processing step for anisotropically etching the portions of the first material layer located between the substrate and bottom surfaces of the spacer films.

3. The method of claim 1, wherein the conformal spacer layer is formed by performing an atomic layer deposition process in which a metallic precursor gas and an agent gas selected from an oxidizing agent gas and a nitriding agent gas are alternately flowed into the chamber enclosure of the in-situ deposition-etch apparatus.

4. The method of claim 1, wherein the conformal spacer layer comprises a material selected from silicon oxide or silicon nitride.

5. The method of claim 1, wherein the conformal spacer layer comprises a material selected from carbon, titanium oxide, titanium nitride, aluminum oxide, aluminum nitride, nickel oxide, tungsten oxide, zirconium oxide, hafnium oxide, hafnium nitride, vanadium oxide, or vanadium nitride.

6. The method of claim 1, wherein the first material layer comprises a silicon oxide material.

7. The method of claim 1, wherein the first material layer comprises a carbon-based material including carbon atoms at an atomic concentration greater than 50%.

8. The method of claim 1, further comprising forming in-process cavities in an upper region of the first material layer by performing a second anisotropic etch process that transfers a pattern in the patterned second material layer into the upper region of the first material layer, wherein the conformal spacer layer is deposited on sidewalls and bottom surfaces of the in-process cavities.

9. The method of claim 8, wherein a combination of the substrate, the first material layer, and the second material layer remain in the in-situ deposition-etch apparatus from a processing step for the first anisotropic etch process to a processing step for anisotropically etching the portions of the first material layer located between the substrate and bottom surfaces of the spacer films.

10. The method of claim 8, wherein at least a portion of the spacer films remain on sidewalls of the first material layer after top surfaces of the substrate are physically exposed.

11. The method of claim 10, further comprising removing remaining portions of the spacer films from the sidewalls of the first material layer selective to a material of the first material layer after the top surfaces of the substrate are physically exposed.

12. The method of claim 1, wherein:
the first anisotropic etch process etches a material of the second material layer selective to a material of the first material layer; and
a horizontal surface of the first material layer on which the conformal spacer layer is deposited is vertically spaced from a top surface of the substrate by at least 95% of a vertical thickness of the first material layer prior to the first anisotropic etch process.

13. The method of claim 12, wherein a lateral thickness of the spacer films gradually decreases during a second anisotropic etch process that anisotropically etches the portions of the first material layer located between the substrate and bottom surfaces of the spacer films.

14. The method of claim 13, wherein the spacer films are completely consumed during the second anisotropic etch process.

15. The method of claim 13, wherein:
in-process cavities formed during the second anisotropic etch process in the first material layer have tapered surfaces that have a first taper angle after etching through 10% of a total thickness of the first material layer; and
cavities formed after the second anisotropic etch process in the first material layer have a second taper angle that is less than the first taper angle.

16. The method of claim 15, wherein the first taper angle is greater than the second taper angle by a difference in a range from 1 degree to 10 degrees.

* * * * *